United States Patent
Wu et al.

(10) Patent No.: US 11,150,681 B2
(45) Date of Patent: Oct. 19, 2021

(54) APPARATUSES AND METHODS FOR PROVIDING REFERENCE VOLTAGES

(71) Applicant: Micron Technology, Inc., Boise, ID (US)

(72) Inventors: Jun Wu, Su Zhou (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/203,215

(22) Filed: Nov. 28, 2018

(65) Prior Publication Data
US 2019/0094900 A1    Mar. 28, 2019

Related U.S. Application Data

(60) Division of application No. 15/117,681, filed as application No. PCT/CN2016/084933 on Jun. 6, (Continued)

(51) Int. Cl.
*G05F 3/26* (2006.01)
*H03M 1/76* (2006.01)
(Continued)

(52) U.S. Cl.
CPC .............. *G05F 3/26* (2013.01); *G11C 5/147* (2013.01); *G11C 7/1084* (2013.01); (Continued)

(58) Field of Classification Search
CPC ......... G05F 3/26; G11C 5/147; G11C 29/021; G11C 29/028; G11C 7/1084; G11C 7/107
See application file for complete search history.

(56) References Cited

U.S. PATENT DOCUMENTS 5,523,721 A * 6/1996 Segawa .................. H03G 3/001
                                                   330/144
6,008,674 A   12/1999 Wada et al.
(Continued)

FOREIGN PATENT DOCUMENTS

CN    101005237 A    7/2007
CN    101063754 A    10/2007
(Continued)

OTHER PUBLICATIONS

First Office Action for KR Application No. 10-2017-7023892, dated Jul. 9, 2018.
(Continued)

*Primary Examiner* — Jue Zhang
(74) *Attorney, Agent, or Firm* — Dorsey & Whitney LLP (57) ABSTRACT

A reference voltage generator is disclosed that may provide a plurality of reference voltages. A reference voltage generator may include a voltage divider, a multiplexer coupled to the voltage divider, an operational amplifier that may receive a voltage from the multiplexer, and a plurality of resistors that may receive an output from the operational amplifier. The reference voltages may be provided from output terminals coupled to the resistors. A reference voltage generator may include a voltage divider, two multiplexers coupled to the voltage divider, an operational amplifier coupled to each multiplexer, and a plurality of resistors coupled between the outputs of the two operational amplifiers. Reference voltages may be provided from output terminals coupled to the resistors.

19 Claims, 7 Drawing Sheets

Related U.S. Application Data 2016, now Pat. No. 10,162,377, which is a continuation-in-part of application No. 14/777,854, filed on Sep. 17, 2015, now Pat. No. 10,168,724, which is a continuation-in-part of application No. PCT/CN2015/081435, filed on Jun. 15, 2015.

(51) Int. Cl.

| | | |
|---|---|---|
| *H03M 1/68* | (2006.01) | |
| *H03M 1/80* | (2006.01) | |
| *G11C 5/14* | (2006.01) | |
| *G11C 29/02* | (2006.01) | |
| *G11C 7/10* | (2006.01) | |

(52) U.S. Cl.
CPC .......... *G11C 29/021* (2013.01); *G11C 29/028* (2013.01); *H03M 1/68* (2013.01); *H03M 1/76* (2013.01); *H03M 1/765* (2013.01); *H03M 1/808* (2013.01); *G11C 7/109* (2013.01)

(56) References Cited

U.S. PATENT DOCUMENTS

| | | | |
|---|---|---|---|
| 6,147,549 | A | 11/2000 | Ohno |
| 7,474,245 | B1 | 1/2009 | Wang et al. |
| 7,504,979 | B1 | 3/2009 | Knausz et al. |
| 8,446,142 | B2 | 5/2013 | Bucur et al. |
| 10,162,377 | B2 | 12/2018 | Wu et al. |
| 10,168,724 | B2 | 1/2019 | Wu et al. |
| 2002/0186230 | A1* | 12/2002 | Kudo .................. G09G 3/3607 345/690 |
| 2002/0192892 | A1 | 12/2002 | Micheloni et al. |
| 2005/0024129 | A1 | 2/2005 | Jang |
| 2006/0049856 | A1 | 3/2006 | Nakai et al. |
| 2006/0050036 | A1 | 3/2006 | Miura |
| 2007/0164888 | A1 | 7/2007 | Park |
| 2007/0217271 | A1 | 9/2007 | Kutz et al. |
| 2007/0247133 | A1 | 10/2007 | Isobe et al. |
| 2007/0274116 | A1 | 11/2007 | Choy et al. |
| 2007/0296388 | A1 | 12/2007 | Sasaki et al. |
| 2008/0278359 | A1 | 11/2008 | Wojewoda |
| 2009/0167280 | A1 | 7/2009 | Wei et al. |
| 2009/0230972 | A1 | 9/2009 | Bucar et al. |
| 2009/0261862 | A1 | 10/2009 | Nguyen et al. |
| 2010/0182348 | A1 | 7/2010 | Okutani |
| 2012/0013385 | A1 | 1/2012 | Kwon |
| 2013/0279517 | A1 | 10/2013 | Efendowicz et al. |
| 2014/0253423 | A1 | 9/2014 | Kinsho |
| 2017/0017252 | A1 | 1/2017 | Wu et al. |
| 2019/0033905 | A1 | 1/2019 | Wu et al. |

FOREIGN PATENT DOCUMENTS

| | | |
|---|---|---|
| CN | 102055314 A | 5/2011 |
| JP | 11121694 A | 4/1999 |
| JP | 2003005845 A | 1/2003 |
| JP | 2009087293 A | 4/2009 |
| WO | 2016201596 A1 | 12/2016 |
| WO | 2016202185 A1 | 12/2016 |

OTHER PUBLICATIONS

U.S. Appl. No. 16/146,982 tilted "Apparatuses and Methods for Providing Reference Voltages" filed Sep. 28, 2018, pp. all.
International Search Report and Written Opinion for PCT Int'l Patent Appl. No. PCT/CN2016/084933 dated Sep. 14, 2016.
Extended European Search Report for EP Application No. 16810926.2 dated Jan. 2, 2019, pp. all.
First Office Action for CN Application No. 201680012764.X dated Apr. 1, 2020.
KR Office Action dated Mar. 3, 2020 for KR Application No. 10-2020-7002899, 4 pgs.
Second Office Action for CN Application No. 201680012764.X, dated Feb. 8, 2021.
Extended European Search Report for EP Application No. 16810926.2, dated Mar. 11, 2021.

* cited by examiner

APPARATUSES AND METHODS FOR PROVIDING REFERENCE VOLTAGES

CROSS REFERENCE TO RELATED APPLICATION(S)

This application is a divisional of U.S. patent application Ser. No. 15/117,681 filed on Aug. 9, 2016 and issued as U.S. Pat. No. 10,162,377 on Dec. 25, 2018, which is a National Stage Application under 35 U.S.C. 371 of International Application No. PCT/CN2016/084933, filed Jun. 6, 2016 and is also a Continuation-In-Part of U.S. patent application Ser. No. 14/777,854 filed on Sep. 17, 2015 and issued as U.S. Pat. No. 10,168,724 on Jan. 1, 2019, and is also a Continuation-In-Part of International Application No. PCT/CN2015/081435, filed Jun. 15, 2015, the applications and patents of which are incorporated herein by reference, in their entirety, for any purpose.

BACKGROUND

Reference voltage generators are used in a variety of applications. For example, reference voltages may be used for digital-to-analog and analog-to-digital applications. Voltage generators may be used for calibration of data and command-address lines in memory devices.

In some applications, it may be desirable to provide a plurality of reference voltages. For example, a device may use more than one reference voltage during operation. Other applications may also benefit from multiple reference voltages.

SUMMARY

An example apparatus according to an embodiment of the disclosure may include a multiplexer that may be configured to receive a plurality of voltages and provide a selected voltage, an operational amplifier that may be configured to receive the selected voltage at a non-inverting input and provide a first reference voltage from an output, a resistor coupled to the output of the operational amplifier, a first adjustable resistor coupled to the resistor, wherein a second reference voltage may be provided from between the resistor and the first adjustable resistor, and a second adjustable resistor coupled to the first adjustable resistor and to an inverting input of the operational amplifier, the second adjustable resistor may be configured to maintain a constant current through the resistor.

Another example apparatus according to an embodiment of the disclosure may include a first operational amplifier that may be configured to receive a first selected voltage at a non-inverting input and provide a first reference voltage from a first output, wherein the first output may be coupled to an inverting input of the first operational amplifier, a second operational amplifier that may be configured to receive a second selected voltage at a non-inverting input and provide a second reference voltage from a second output, wherein the second output may be coupled to an inverting input of the second operational amplifier, and a voltage divider may be coupled between the first output and the second, the voltage divider may be configured to provide a plurality of reference voltages, each of the plurality of reference voltages may have a respective voltage between a voltage of the first output and a voltage of the second output.

An example method according to an embodiment of the disclosure may include providing a selected voltage to an operational amplifier and outputting a first reference voltage; dividing with a first resistor the first reference voltage to provide a plurality of reference voltages; providing an output of the first resistor as feedback to the operational amplifier; and maintaining a constant current through the resistor.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples of reference voltage generators are described herein that may allow for multiple reference voltages to be provided at the same time. The reference voltage generators may allow a voltage difference between the multiple reference voltages to be held constant, even if the voltage levels of the reference voltages is changed. This may allow voltage ratios within and/or between circuits coupled to the reference voltages to be maintained across a range of voltage levels. The voltage levels of the reference voltages may be controlled, at least in part, by providing a selected voltage from a voltage divider. The selection of voltage levels and constant difference between reference voltages may facilitate calibration of circuits and/or devices.

Figure 1:
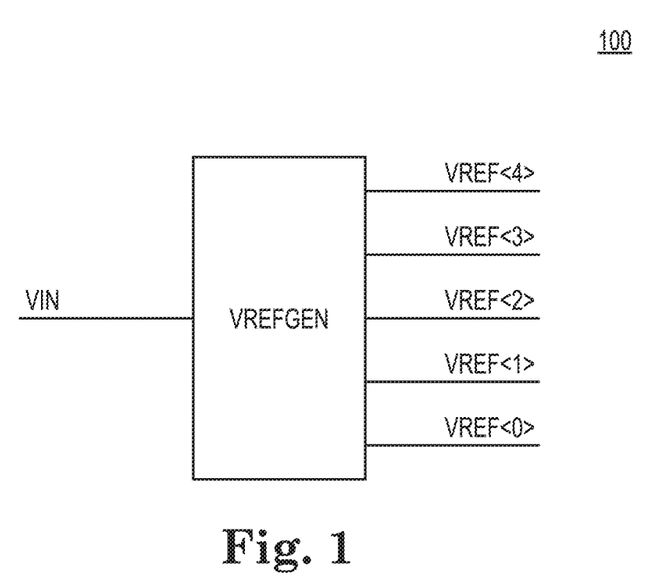
FIG. 1 is a block diagram of a reference voltage generator according to an embodiment of the disclosure.

FIG. 1 illustrates an apparatus including a reference voltage generator (VREFGEN) 100 according to an embodiment of the disclosure. As used herein, apparatus may refer to, for example, a circuit, an integrated circuit, a memory device, a memory system, an electronic device or system, a smart phone, a tablet, a computer, a server, etc. VREFGEN 100 may receive an input voltage VIN and provide a plurality of reference voltages VREF<0-4>. VREFGEN 100 may maintain a constant voltage difference between each of the reference voltages VREF<0-4>. For example, the voltage difference between VREF<0> and VREF<1> may be 5 mV. If VREF<0> is set to −10 mV, VREF<1> may be −5 mV. Continuing with this example, if VREFGEN 100 is modified such that VREF<0> is set to −12 mV, VREF<1> may be −7 mV. In some embodiments, the voltage difference between the adjacent reference voltages may be equal (e.g., VREF<4>=10 mV, VREF<3>=5 mV, VREF<2>=0 mV, etc.). In some embodiments, the voltage difference between one set of adjacent reference voltages may be different than the voltage difference between a second set of adjacent reference voltages. For example, the voltage difference between VREF<0> and VREF<1> may be 5 mV, and the voltage difference between VREF<1> and VREF<2> may be 10 mV. Other configurations of reference voltages may be possible. VREFGEN 100 is shown in FIG. 1 as providing five reference voltages; however, in some embodiments VREFGEN 100 may be configured to provide more or fewer reference voltages.

Figure 2A:
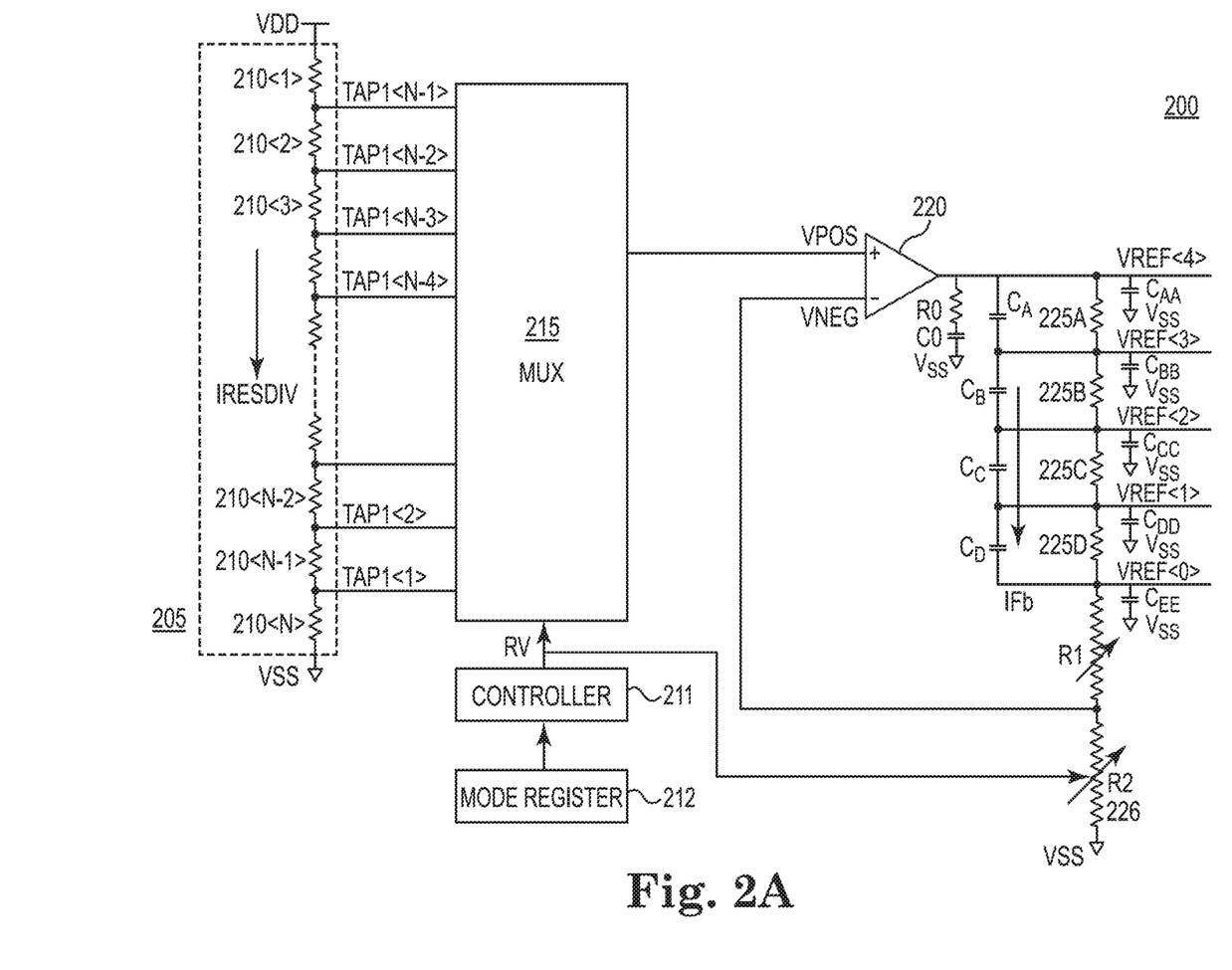
FIG. 2A is a circuit diagram of a reference voltage generator according to an embodiment of the disclosure.

FIG. 2A is a circuit diagram of a reference voltage generator 200 according to an embodiment of the disclosure. The reference voltage generator 200 may be used to implement VREFGEN 100 shown in FIG. 1 in some embodiments. The reference voltage generator 200 may include a voltage divider 205 coupled to a multiplexer (MUX) 215. The multiplexer 215 may be coupled to an operational amplifier (op-amp) 220. The op-amp 220 may be further coupled to a plurality of resistors 225A-D that are coupled in series. The series coupled resistors 225A-D may be coupled to one or more lines for providing reference voltages VREF<0-4>.

The voltage divider 205 may be coupled to a source voltage VDD (e.g., a positive supply) and a reference voltage VSS (e.g., a negative supply, ground, etc.). The voltage divider 205 may include resistors 210<1> to 210<N>. Here, "N" is a natural number which represents a number of resistors 210<1> to 210<N>. The resistors 210<1> to 210<N> may divide the source voltage VDD to provide one or more voltages as TAP1<N−1:1> to the multiplexer 215. For example, TAP1<N−1> may be between the resistors 210<1> and 210<2> and TAP1<N−2> may be between the resistors 210<2> and 210<3>. For example, the resistors 210<1:N+1> may have an identical resistance and the voltage difference between the adjacent resistors 210 may be represented as VDD/N. In some embodiments, the current IRESDIV through the resistors 210<1> to 210<N> may be relatively low (e.g. 1-30 µA). Voltage dividers other than that shown in FIG. 2A may also be used.

Figure 2B:
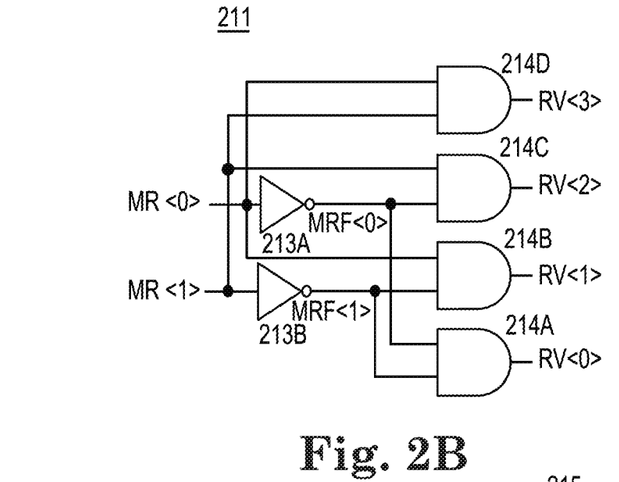
FIG. 2B is a circuit diagram of a controller according to an embodiment of the disclosure.

The voltage divider 205 may provide the one or more voltages to the multiplexer 215. The multiplexer 215 may be controlled by a controller 211 to provide a voltage from the voltage divider 205 as a selected voltage VPOS. For example, the controller 211 may provide a reference voltage (RV) parameter to the multiplexer 215 for adjusting the reference voltages VREF<0-4>. For example, the RV parameter may be provided as a plurality of bits based on a value programmed in a mode register MR 212. For example, mode register bits MR<5:0>(6-bits) of the mode register MR 212 may be used for programming a value on which the RV parameter provided by the controller 211 is based. In some embodiments, the controller 211 may provide the RV parameter based on mode register bits MR<1:0>(2-bits) of the mode register MR 212. FIG. 2B is a circuit diagram of a controller 211 according to an embodiment of the disclosure. The controller 211 may be a decoder that provides the RV parameter responsive to the mode register bits. For example, the controller 211 may receive the two mode register bits MR<1> and MR<0>. The controller may include two inverters 213A and 213B to provide the complementary mode register signals MRF<1> and MRF<0> responsive to the two mode register bits MR<1> and MR<0>. The controller includes a plurality of AND circuits 214A to 214D. For example, the AND circuit 214A receives a combination of MRF<0> and MRF<L> and provides RV<0>. Thus, the AND circuit 214A provides an active RV<0> (e.g., having a logic high level) responsive to the MR<1:0> being "00". Similarly, the AND circuits 214B to 214D provide active RV<1:3> (e.g., having a logic high level) responsive to the MR<1:0> being "01", "10" and "11". Thus, responsive to a combination of the mode register bits, one bit of bits of the RV parameter may be activated.

Figure 2C:
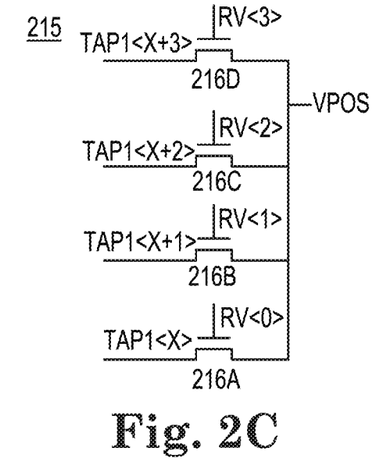
FIG. 2C is a circuit diagram of a multiplexer according to an embodiment of the disclosure.

Responsive to the RV parameter, the multiplexer 215 may provide the selected voltage VPOS to a non-inverting input of the op-amp 220. In some embodiments, the multiplexer 215 may be one or more switches which couple the voltage divider 205 to the non-inverting input of the op-amp 220 responsive to the RV parameter. FIG. 2C is a circuit diagram of a multiplexer according to an embodiment of the disclosure. The multiplexer 215 may include switches 216A to 216D that receive the RV parameter responsive to the mode register bits. For example, the switches 216A to 216D may receive the respective bit of RV parameter <0:3>. In this example, the switches 216A to 216D may selectively couple one of the TAP1<X:X+3> to the VPOS responsive to the RV<0:3>. Here, "X" is a natural number smaller than N−3 which represents a set resistors 210<X> to 210<X+3> to be coupled. The one bit of bits of the RV parameter may be activated to turn on a corresponding switch of the switches 216A to 216D based on a combination of the mode register bits. The TAP1<X:X+3> may be coupled to the voltage divider 205 which includes the resistors 210<1> to 210<N>. As described earlier, the voltage difference between adjacent taps TAP1<X> and TAP1<X+> becomes equal to VDD/N. Thus, one of the voltages provided to the TAP1<X:X+3> may be provided to the op-amp 220. The op-amp 220 may output a reference voltage VREF<4> to a resistor 225A.

The resistors 225A-D may act as a voltage divider to provide the reference voltages VREF<0-4>. The magnitude of the resistors 225A-D may be chosen to provide a desired voltage difference between each adjacent reference voltage VREF <0-4>. In some embodiments, the resistors 225A-D are equal in magnitude. In some embodiments, the resistors 225A-D are different magnitudes. Although four resistors 225A-D and five reference voltages VREF<0-4> are shown in FIG. 2A, more or fewer resistors and reference voltages may be provided.

An adjustable resistor R1 may be coupled to the resistors 225A-D. The magnitude of the adjustable resistor R1 may be adjusted to trim op-amp offsets and mismatches. In some embodiments, the adjustable resistor R1 may be a trimmed resistor. In some embodiments, the adjustable resistor R1 may include a fuse. In some embodiments, the adjustment of the magnitude of the adjustable resistor R1 may be set during a test procedure. The adjustable resistor R1 may be omitted or have a constant resistance value if trimming the op-amp offsets and mismatches is not required.

The adjustable resistor R1 may be coupled to the inverting input of op-amp 220 and an adjustable resistor R2 226. The adjustable resistor R2 226 may also be coupled to a reference voltage VSS. An inverting voltage VNEG on a node between the adjustable resistor R1 and the adjustable resistor R2 226 may be provided to an inverting input of the op-amp 220, so that the op-amp 220 may control its output voltage VREF<4> such that the selected voltage VPOS and the inverting voltage VNEG become substantially equal to each other. The magnitude of the adjustable resistor R2 226 may be adjusted by the controller 211 to keep the current IFb through the resistors 225A-D constant. Keeping IFb constant over a range of voltages may allow the reference voltages VREF<0-4> to maintain a constant voltage difference between each reference voltage. Thus, the constant voltage difference between each reference voltage may be maintained by controlling the magnitude of the adjustable resister R2 226 responsive to the RV parameter, for example, when the voltage provided to resistors 225A-D is altered. As previously described, the voltage provided to resistors 225A-D may be altered when the VPOS voltage is changed, such as during a selection of a desired VPOS voltage. The change in the VPOS voltage results in changing the voltage VREF<A>. Changing the voltage VREF<4> may change the current IFb through the resistors 225A-D due to the relationship i=V/R. Due to negative feedback scheme for the op-amp 220, the VNEG voltage always tracks and equals to the VPOS voltage. As a result, there is a relationship between the voltage of VPOS and the current IFb through the resistor R2 226: IFb=VPOS/R2.

The adjustable resistor R2 226 may be adjusted to increase or decrease the resistance between VNEG and the reference voltage VSS, and consequently, be used to maintain a constant current IFb for different VPOS voltages. For example, the adjustable resistor R2 226 may be adjusted to a relatively higher resistance when the VPOS voltage is adjusted to a higher voltage (resulting in a higher VNEG voltage) so that the current IFb does not increase for the higher VPOS voltage. Conversely, the adjustable resistor R2 226 may be adjusted to a relatively lower resistance when the VPOS voltage is adjusted to a lower voltage (resulting in a lower VNEG voltage) so that the current IFb does not decrease for the lower VPOS voltage.

Due to the relationship between the VPOS voltage and the IFb current (by virtue of the VNEG voltage), the adjustable resistor R2 226 may be adjusted based on the RV parameter, which as previously described is used by the controller 211 to select the VPOS voltage. Thus, the value programmed in the mode register 212 (e.g., MR<5:0>. MR<1:0>) may be the basis for selection of the VPOS voltage and for adjusting the resistor R2 226. For example, the magnitude of the adjustable resistor R2 226 may be controlled responsive to the RV parameter, which is provided to the multiplexer 215 for adjusting the reference voltages VREF<0-4>, in a manner that IFb=VPOS/R2 keeps constant.

Figure 2D:
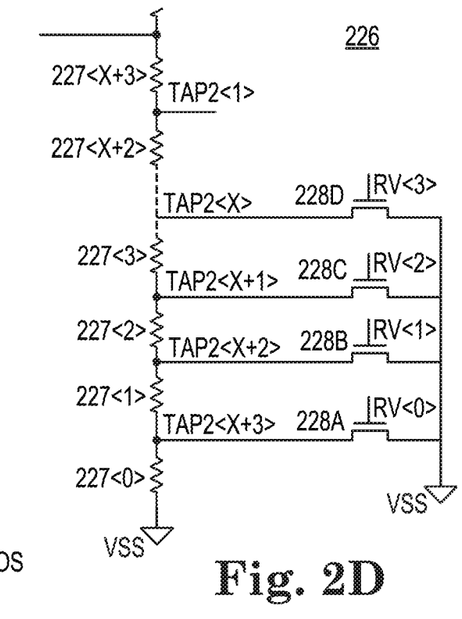
FIG. 2D is a circuit diagram of an adjustable resistor according to an embodiment of the disclosure.

In some embodiments, the adjustable resistor R2 226 may be configured to include a plurality of unit resistors connected in series with and/or in parallel to one another through a plurality of electrical switches. As shown in FIG. 2A, the controller 211 may provide the RV parameter to the adjustable resistor R2 226. FIG. 2D is a circuit diagram of an adjustable resistor 226 according to an embodiment of the disclosure. The adjustable resistor R2 226 may include switches 228A to 228D that receive the RV parameter from the controller 211 responsive to the mode register bits, so that selected one or ones of the switches 228A to 228D and remaining one or ones thereof may be controlled to turn ON or OFF responsive, at least in part, to the RV parameter from the controller 211. The value programmed in the mode register 212 (e.g., MR<5:0>, MR<1:0>) may be used in place of the parameter RV. For example, the switches 228A to 228D may receive the respective bit of RV parameter RV<3:0>. As shown in FIG. 2D, the switches 228A to 228D may selectively couple one of the TAP2<X+3:X> to the reference voltage VSS responsive to the RV<0:3>, because the one bit of bits of the RV parameter may be activated to turn on a corresponding switch of the switches 228A to 228D based on a combination of the mode register bits. The adjustable resistor R2 226 includes a plurality of resistors 227<0> to 227<X+3>. For example, TAP2<X+1> may be between the resistors 227<3> and 227<2> and TAP2<X+2> may be between the resistors 227<2> and 227<1>. The TAP2<X+3:X> may be selectively coupled to the reference voltage VSS, thus the resistors 227 between the inverting voltage VNEG and the reference voltage VSS may provide a resistance of the adjustable resistor R2 226. Here, based on the RV parameter, TAP1<X> and TAP2<X> may be selected simultaneously. Thus, the number of resistors 210 between the TAP1<X> coupled to the VPOS and the reference voltage VSS and the number of resistors 227 between the TAP2<X> coupled to the reference voltage VSS and the inverting voltage VNEG correspond to each other. In this manner, the VPOS and the VNEG becomes substantially equal. As described the above, when the RV parameter changes to alter the voltage VPOS (and thus changes the output voltage VREF<4>), the voltage VNEG is changed to become substantially equal to the changed voltage VPOS. The resistance of the adjustable resistor R2 226 is also changed by the RV parameter to make the current IFb substantially constant. The voltage drops across the resistors 225A, 225B. 225C and 225D are thus kept substantially constant, while the absolute values of each of the reference voltages VREF<0> to VREF<4> may be changed in accordance with the voltage VPOS controlled by the RV parameter.

In some embodiments, decoupling capacitors (e.g., $C_{AA}$, $C_{BB}$, $C_{CC}$, $C_{DD}$, $C_{EE}$) may be provided between an output terminal for each reference voltage VREF<0-4> and the reference voltage VSS line. The decoupling capacitors may be chosen based on the loads to which the reference voltages are provided. In some embodiments, decoupling capacitors (e.g., $C_A$, $C_B$, $C_C$, $C_D$) may be provided between adjacent reference voltage output terminals. The decoupling capacitors between adjacent reference voltage output terminals may be desirable when the voltage provided from the output of the op-amp 220 changes rapidly. The decoupling capacitors between adjacent reference voltage output terminals may decrease the response time of the reference voltage generator 200. In some embodiments, the current IFb through resistors 225A-D may be relatively high (e.g., 140 µA or higher), which may also decrease the response time of the reference voltage generator 200.

In some embodiments, a resistor R0 and capacitor C0 coupled in series with the reference voltage VSS line may be coupled to the output terminal of reference voltage VREF<4>. The magnitudes for the resistor and capacitor may be selected to compensate for op-amp 220 (e.g., pole zero tracking frequency compensation). This may provide more stability for voltage generator 200.

Figure 3:
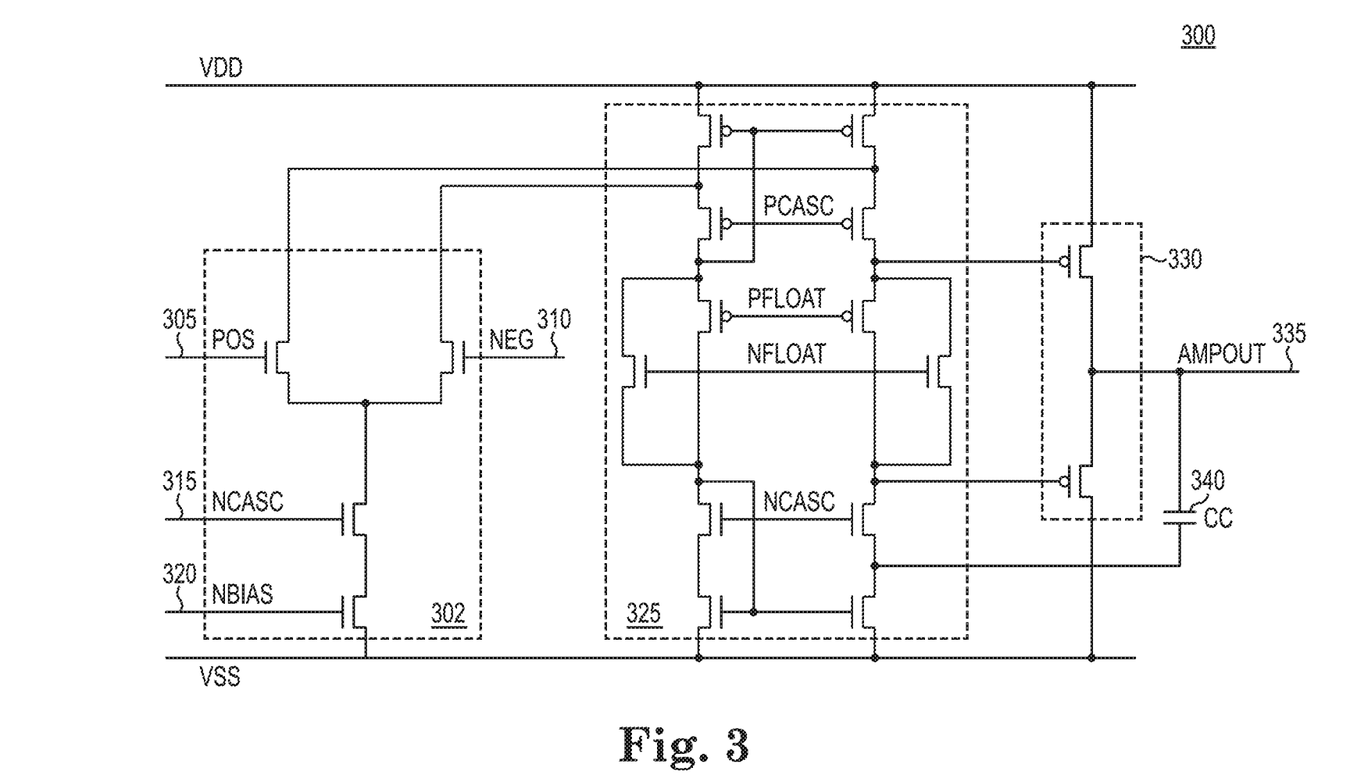
FIG. 3 is a circuit diagram of a Class AB operational amplifier according to an embodiment of the disclosure.

FIG. 3 is a circuit diagram of a Class AB operational amplifier (op-amp) 300 according to an embodiment of the disclosure. The op-amp 300 may be used to implement op-amp 220 illustrated in FIG. 2 in some embodiments. A Class AB op-amp may provide a strong driving strength that may facilitate a fast response time of a reference voltage generator, such as reference voltage generator 200, regardless of whether voltage levels are rising or falling.

The op-amp 300 is a multi-stage op-amp configuration. The op-amp 300 includes an input stage 302. The voltage from a multiplexer, such as multiplexer 215 (see FIG. 2A), is provided to the non-inverting input 305 of the input stage 302. A feedback signal may be provided to the inverting input 310 of the input stage 302. The inputs 305, 310 of the input stage 302 may be biased by nCasc and nBias voltages 315, 320 provided to bias transistors of the input stage 302. The input stage 302 provides input voltages to an amplification stage 325. The amplification stage 325 may include one or more transistors configured as one or more current mirrors. Amplification stage 325 may include one or more current mirrors in cascode configuration and/or other configuration. Amplification stage 325 may receive one or more biases voltages pCasc, pFloat, nFloat, nCasc to facilitate stability and/or Class AB performance. The type and number of biases utilized by the amplification stage 325 may vary based on the chosen Class AB op-amp configuration. The output of the amplification stage 325 may be provided to an output stage 330 that provides an output voltage at output 335 of op-amp 300. The output voltage may be provided to a plurality of resistors, such as resistors 225A-D (not shown in FIG. 3). In some embodiments, a capacitor 340 may be coupled between the output 335 and a transistor of the amplification stage 325 to facilitate frequency compensation. Optionally, a resistor may be coupled in series with capacitor 340. The op-amp 300 is provided as a non-limiting example. Other Class AB op-amps may also be used in embodiments of the invention.

Figure 4:
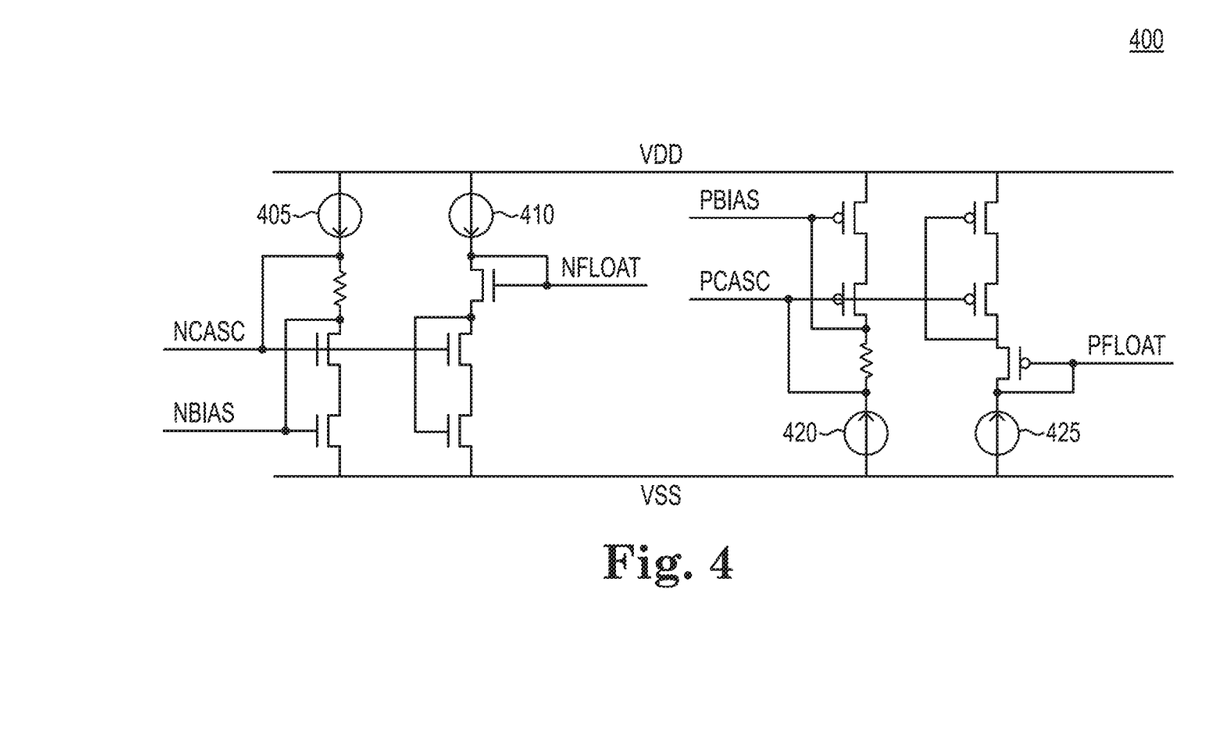
FIG. 4 is a circuit diagram of a bias circuit according to an embodiment of the disclosure.

FIG. 4 is a circuit diagram of a bias circuit 400 according to an embodiment of the disclosure. The bias circuit 400 may be used to provide the bias voltage for op-amp 300 illustrated in FIG. 3. The bias circuit 400 may include transistors, resistors, current sources, and other circuit elements configured to provide various bias voltages. The bias circuit 400 may provide bias voltages nBias, nCasc, nFloat, pBias, pCasc, and pFloat, for example, to op-amp 300. The nCasc and nBias bias voltages may both be generated using current source 405. The nFloat may be generated using current source 410. The pCasc and pBias may be generated using current source 420, and pFloat may be generated using current source 425. In some embodiments one or more of the current sources 405-425 may provide the same current (e.g., 26 µA). In some embodiments, the current sources 405-425 may provide different currents. The bias circuit 400 is provided as a non-limiting example. More or fewer bias voltages may be generated, which may be based on the configuration of the operational amplifier. Other bias circuits may also be used in embodiments of the invention.

Figure 5:
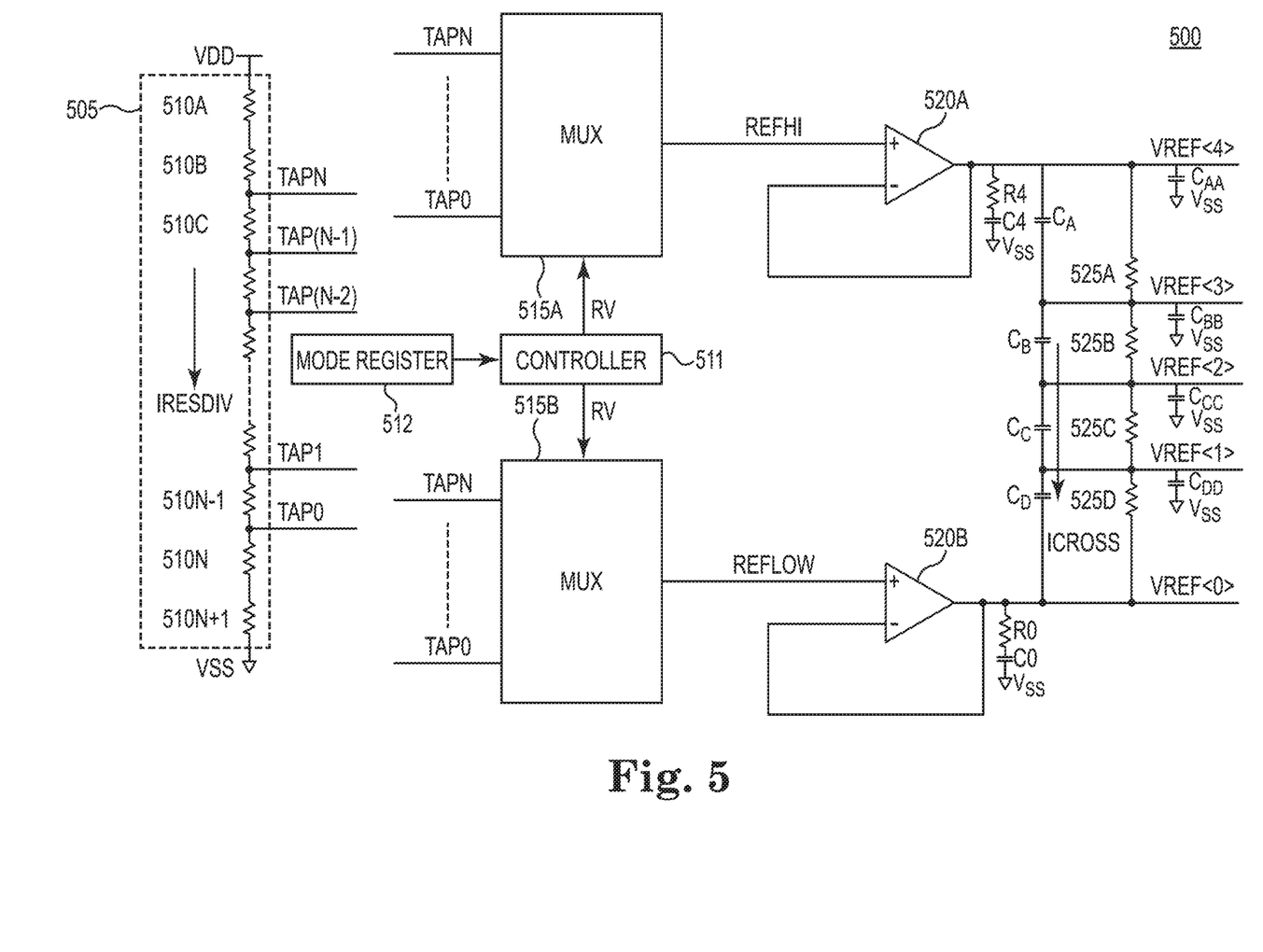
FIG. 5 is a circuit diagram of a reference voltage generator according to an embodiment of the disclosure.

FIG. 5 is a circuit diagram of a reference voltage generator 500 according to an embodiment of the disclosure. The reference voltage generator 500 may be used to implement VREFGEN 100 shown in FIG. 1. The reference voltage generator 500 may include a voltage divider 505 coupled to multiplexers (MUX) 515A-B. Each multiplexer 515A-B may be coupled to a corresponding op-amp 520A-B. The op-amps 520A-B may be further coupled to a plurality of resistors 525A-D coupled in series. The resistors 525A-D may be coupled to one or more lines for providing reference voltages VREF<0-4>.

The voltage divider 505 may be similar to voltage divider 205 illustrated in FIG. 2. The voltage divider 505 may be coupled to a source voltage VDD and a reference voltage VSS. The voltage divider 505 may include resistors 510A-N+1. The resistors 510A-N+1 may divide the source voltage VDD into one or more voltages. In some embodiments, the current IRESDIV through the resistors 510A-N+1 may be relatively low (e.g. 1-30 µA). Other voltage dividers may also be used. The voltage divider 505 may provide one or more voltages to multiplexers 515A-B.

The multiplexers 515A-B may be operated by one or more controllers 511. For example, the one or more controllers 511 may provide a reference voltage (RV) parameter to the multiplexers 515A-B for adjusting the reference voltages VREF<4> and VREF<0>, respectively. For example, the RV parameter may be provided by the one or more controller 511 as a plurality of bits based on a value programmed in a mode register MR 512. Responsive to the RV parameter, the multiplexer 515A may provide a voltage REFHI selected from one of the TAP voltages (e.g., TAPN, TAP(N−1), . . . etc.) to a non-inverting input of an operational amplifier (op-amp) 520A. The op-amp 520A may provide an output voltage VREF<4> to resistor 525A. The output of op-amp 520A may be fed back to the inverting input of op-amp 520A, so that the output voltage VREF<4> is substantially equal to the voltage REFHI. Also responsive to the RV parameter, the multiplexer 515B may provide a voltage REFLOW selected from one of the TAP voltages to a non-inverting input of an op-amp 520B. The op-amp 520B may provide an output voltage VREF<0> to resistor 525D. The output of op-amp 520B may be fed back to the inverting input of op-amp 520B.

The reference voltage generator 500 may be configured so that the output of the op-amp 520A is provided as VREF<4> responsive to the voltage REFHI and the output of op-amp 520B is provided as VREF<0> responsive to the voltage REFLOW. The resistors 525A-D may act as a voltage divider and provide reference voltages VREF<0-4>. The magnitude of the resistors 525A-D may be chosen to provide a desired voltage difference between each adjacent reference voltage VREF<0-4>. In some embodiments, the resistors 525A-D are equal in magnitude. In some embodiments, the resistors 525A-D are different magnitudes. In some embodiments, the reference voltage generator 500 may be configured so that VREF<4> is equal to voltage REFHI and VREF<0> is equal to voltage REFLOW. Although four resistors 525A-D and five reference voltages VREF<0-4> are shown in FIG. 5, more or fewer resistors and reference voltages may be included in some embodiments.

In some embodiments, the voltage difference between VREF<4> and VREF<0> is constant. Thus, both VREF<4> and VREF<0> are changed together (e.g., based on the RV parameter) to maintain the constant voltage difference. For example, assuming a first RV parameter, a first TAP voltage is provided as the REFHI voltage and a second TAP voltage is provided as the REFLOW voltage, and the voltage difference between REFHI and REFLOW voltages for the first RV parameter is deltaV1. Assuming a second RV parameter, a different first TAP voltage is provided as the REFHI voltage and a different second TAP voltage is provided as the REFLOW voltage, and the voltage difference between the REFHI and REFLOW voltages for the second RV parameter is deltaV2, where deltaV1 and deltaV2 are equal. As illustrated by the previous non-limiting example, VREF<4> and VREF<0> may be changed, but the voltage difference between VREF<4> and VREF<0> may remain constant.

By maintaining the constant voltage difference between VREF<4> and VREF<0>, the current ICROSS may be constant although VREF<4> and VREF<0> voltages are changed. As a result of the constant ICROSS current, the voltage difference between the voltages VREF<0>, VREF<1>, VREF<2>, VREF<3>, VREF<4> can be maintained, even when the VREF<4> and VREF<0> voltages are changed, for example, based on the RV parameter. Each of the op-amp 520A and the op-amp 520B may be configured as a Class AB operational amplifier as discussed with reference to FIGS. 3 and 4.

When the reference voltages VREF<0-4> move from a high level to a low level, the op-amp 520B may provide a strong pull-down driving strength. Similarly, when the reference voltages VREF<0-4> move from a low level to a high level, the op-amp 520A may provide a strong pull-up driving strength. The complementary driving strength of the op-amps 520*a-b* may decrease the response time of the voltage generator 500. The current ICROSS through the resistors 525A-D may be relatively high (e.g., 140 µA or higher), which may also decrease the response time of the reference voltage generator 500. The mismatch of op-amps 520A-B may be minimized, which may inhibit current ICROSS from approaching zero.

In some embodiments, decoupling capacitors (e.g., $C_{AA}$, $C_{BB}$, $C_{CC}$, $C_{DD}$, $C_{EE}$) may be provided between each output terminal for reference voltages VREF<0-4> and the reference voltage VSS line. The decoupling capacitors may be chosen based on the loads to which the reference voltages are provided. In some embodiments, decoupling capacitors (e.g., $C_A$, $C_B$, $C_C$, $C_D$) may be provided between adjacent reference voltage output terminals. The decoupling capacitors between adjacent reference voltage output terminals may be desirable when the voltage provided from the outputs of the op-amps 520A-B changes rapidly. The decoupling capacitors between adjacent reference voltage output terminals may decrease the response time of the reference voltage generator 500.

In some embodiments, a resistor R4 and capacitor C4 and/or resistor R0 and capacitor C0 coupled in series with the reference voltage VSS line may be coupled to the output terminal of reference voltage VREF<4> and/or VREF<0>, respectively. The resistor and capacitor may be selected to compensate for op-amps 520A-B (e.g., pole zero tracking frequency compensation). This may provide more stability for voltage generator 500.

The reference voltage generators 100, 200, and/or 500 may be used to provide multiple reference voltages at the same time. The reference voltage generators described herein may have a rapid response time even with a large capacitive load on the reference voltage line. In some embodiments, the reference voltage generators 100, 200, and/or 500 described herein may be used for mismatch calibration of input buffers for data DQ and/or command/address of a memory device. The availability of multiple reference voltages at the same time may allow each input buffer to receive a different reference voltage. The ability to select from a variety of voltage levels from a voltage divider with one or more multiplexers may allow for a wide range of reference voltage levels to be used. This may facilitate minimizing the input buffer mismatch. The reference voltage generators 100, 200, and/or 500 may be used in other applications as well.

Figure 6:
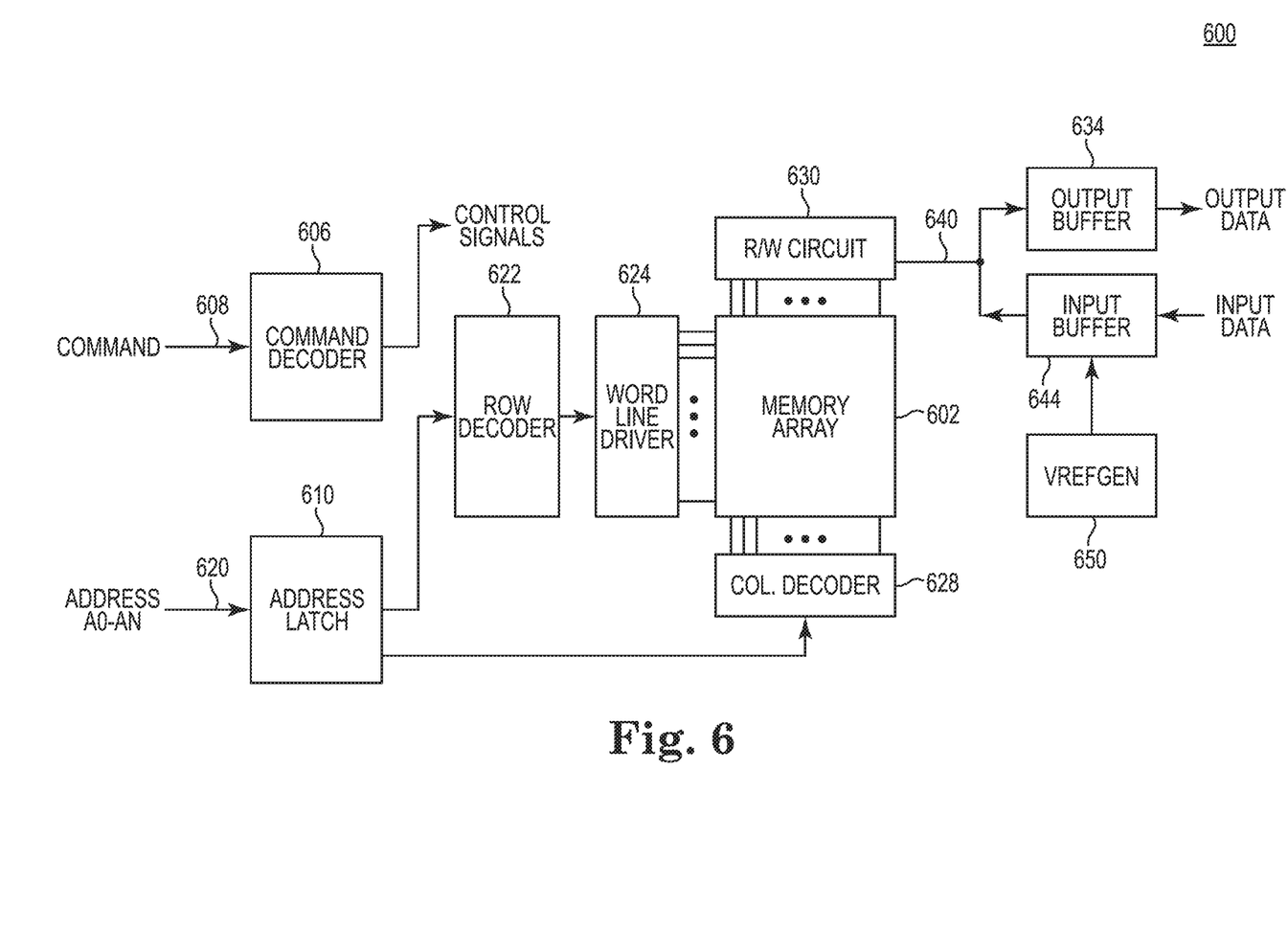
FIG. 6 is a block diagram of a memory according to an embodiment of the disclosure.

FIG. 6 illustrates a memory 600 according to an embodiment of the disclosure. The memory 600 includes an array 602 of memory cells, which may be, for example, volatile memory cells (e.g., DRAM memory cells, SRAM memory cells), non-volatile memory cells (e.g., flash memory cells), or some other types of memory cells. The memory 600 includes a command decoder 606 that receives memory commands through a command bus 608 and generates corresponding control signals within the memory 600 to carry out various memory operations. The command decoder 606 responds to memory commands applied to the command bus 608 to perform various operations on the memory array 602. For example, the command decoder 606 is used to generate internal control signals to read data from and write data to the memory array 602. Row and column address signals are applied to the memory 600 through an address bus 620 and provided to an address latch 610. The address latch 610 then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630.

The input data buffer 644 may receive data from a memory controller (not shown), for example, for storing in the array 602 in response to a write command, for example. The output buffer 634 may provide data stored in the array 602 to the memory controller in response to a read command, for example.

In some embodiments, the input data buffer 644 may be coupled to a reference voltage generator (VREFGEN) 650. VREFGEN 650 may be implemented according to an embodiment disclosed herein, for example, the reference voltage generator 200 illustrated in FIG. 2 or the reference voltage generator 500 illustrated in FIG. 5. VREFGEN 650 may provide one or more reference voltages to the input data buffer 644. In some embodiments, the VREFGEN 650 may provide one or more reference voltages to an input data line of the input buffer 644. The one or more reference voltages may be used to calibrate the input data buffer 644. In some embodiments, a multiplexer (not shown) may couple VREFGEN 650 to input buffer 644. The multiplexer may apply a selected reference voltage of the one or more reference voltages from VREFGEN 650 to input buffer 644. In some embodiments, the input buffer 644 may include multiple input buffers, and one or more reference voltages may be provided to the multiple input buffers from VREFGEN 650. Other configurations may also be used.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. An apparatus comprising:
a first operational amplifier configured to receive a first selected voltage at a first input and provide a first reference voltage from a first output, wherein the first output is coupled to a second input of the first operational amplifier;
a second operational amplifier configured to receive a second selected voltage at a first input and provide a second reference voltage from a second output, wherein the second output is coupled to a second input of the second operational amplifier; and
a voltage divider coupled between the first output and the second output, and is configured to provide a plurality of reference voltages, each of the plurality of reference voltages having a respective voltage between a voltage of the first output and a voltage of the second output;

wherein at least one of the first operational amplifier or the second operational amplifier is a Class AB operational amplifier.

2. The apparatus of claim 1 further comprising:
a first multiplexer coupled to the first operational amplifier and is configured to select a first voltage from a plurality of voltages and provide the first selected voltage to the first operational amplifier; and
a second multiplexer coupled to the second operational amplifier and is configured to select a second voltage from the plurality of voltages and provide the second selected voltage to the second operational amplifier.

3. The apparatus of claim 2 further comprising:
an input voltage divider configured to receive an input voltage and divide the input voltage to provide the plurality of voltages.

4. The apparatus of claim 2 further comprising a controller coupled to the first and second multiplexers, wherein the controller is configured to control the first and second multiplexers to select the first and second selected voltages provided to the first and second operational amplifiers, respectively.

5. The apparatus of claim 4, wherein the controller comprises:
a register storing one or more mode register bits;
an inverter coupled to the register and configured to provide at least a complementary mode signal responsive to the one or more mode register bits; and
a plurality of AND circuits configured to receive a combination of the one or more mode register bits and the complementary mode signal to provide a respective reference parameter to the first and second multiplexers.

6. The apparatus of claim 1, wherein the voltage divider comprises a plurality of resistors coupled in series, wherein a separate reference voltage of the plurality of reference voltages is provided from between each of the plurality of resistors.

7. The apparatus of claim 6, wherein the separate reference voltages are different from each other and from the first and second reference voltages.

8. The apparatus of claim 1, wherein a difference between the first and second reference voltages is independent of the first selected voltage or the second selected voltage.

9. The apparatus of claim 1, wherein a current through the voltage divider is constant.

10. An apparatus comprising:
a first circuit including a first terminal, a second terminal, and two or more resistors coupled in series between the first and second terminals to provide one or more serial coupling nodes of the two or more resistors, the first circuit further including first and second output terminals that are coupled respectively to selected two of the first terminal, the second terminal and the one or more serial coupling nodes;
a second circuit configured to supply the first terminal with a first voltage responsive, at least in part, to first control information and with a second voltage responsive, at least in part, to second control information;
a third circuit configured to cause a current flowing through the two or more resistors when the first terminal is supplied with the first voltage equal to a current flowing through the two or more resistors when the first terminal is supplied with the second voltage, wherein the second voltage is different from the first voltage;
a first multiplexer coupled to the first operational amplifier and is configured to receive a plurality of voltages, select a first voltage from the plurality of voltages and provide the first selected voltage to the first operational amplifier; and
a second multiplexer coupled to the second operational amplifier and is configured to receive the plurality of voltages, select a second voltage from the plurality of voltages and provide the second selected voltage to the second operational amplifier.

11. The apparatus of claim 10, wherein:
the second circuit comprises an operational amplifier including first and second inputs and an output, the first input configured to receive a third voltage for the first voltage responsive, at least in part, to the first control information and a fourth voltage for the second voltage responsive, at least in part, to the second control information, the second input configured to receive a fifth voltage based, at least in part, on a voltage drop across the variable resistor, and the output coupled to the first terminal.

12. The apparatus of claim 10, wherein:
the second circuit comprises a first operational amplifier including first and second inputs and a first output, the first input configured to receive the first voltage responsive, at least in part, to the first control information and the second voltage responsive, at least in part, to the second control information, the second input configured to be coupled to the first output, and the first output configured to be coupled to the first terminal; and
the third circuit comprises a second operational amplifier including third and fourth inputs and a second output, the third input configured to receive a third voltage responsive, at least in part, to the first control information and with a fourth voltage responsive, at least in part, to the second control information, and the fourth input configured to be coupled to the second output, and the second output configured to be coupled to the second terminal.

13. The apparatus of claim 12 further comprising an additional variable resistor coupled between the second terminal and the one or more serial coupling nodes.

14. A method comprising:
selecting a first voltage from a plurality of voltages to provide the first voltage to a first operational amplifier;
by the first operational amplifier:
receiving the first voltage at a first input of the first operational amplifier; and
providing a first reference voltage at a first output;
selecting a second voltage from the plurality of voltages to provide the second voltage to a second operational amplifier;
by the second operational amplifier:
receiving the second voltage at a first input of the second operational amplifier; and
providing a second reference voltage at a second output; and
providing a plurality of reference voltages, each of the plurality of reference voltages having a respective voltage between a voltage of the first output and a voltage of the second output.

15. The method of claim 14 further comprising:
receiving an input voltage and dividing the input voltage to provide the plurality of voltages.

16. The method of claim 14 further comprising controlling first and second multiplexers to respectively select the first and second selected voltages provided to the first and second operational amplifiers.

17. The method of claim 16, wherein controlling the first and second multiplexers comprises:
- receiving one or more mode register bits;
- inverting at least one or the mode register bits to provide a complementary mode signal;
- using a plurality of AND circuits to receive a combination of the one or more mode register bits and the complementary mode signal to provide a respective reference parameter to the first and second multiplexers.

18. An apparatus comprising:
- a first operational amplifier configured to receive a first selected voltage at a first input and provide a first reference voltage from a first output, wherein the first output is coupled to a second input of the first operational amplifier;
- a second operational amplifier configured to receive a second selected voltage at a first input and provide a second reference voltage from a second output, wherein the second output is coupled to a second input of the second operational amplifier;
- a voltage divider coupled between the first output and the second output, and is configured to provide a plurality of reference voltages at respective nodes, each of the plurality of reference voltages having a respective voltage between a voltage of the first output and a voltage of the second output; and
- a plurality of capacitors each coupled to the first output, the second output, or one of the respective nodes.

19. An apparatus comprising:
- a first operational amplifier configured to receive a first selected voltage at a first input and provide a first reference voltage from a first output, wherein the first output is coupled to a second input of the first operational amplifier;
- a second operational amplifier configured to receive a second selected voltage at a first input and provide a second reference voltage from a second output, wherein the second output is coupled to a second input of the second operational amplifier;
- a voltage divider coupled between the first output and the second output, and is configured to provide a plurality of reference voltages, each of the plurality of reference voltages having a respective voltage between a voltage of the first output and a voltage of the second output;
- a first pair of resistor and capacitor coupled in series between the first output and a negative voltage supply; and
- a second pair of resistor and capacitor coupled in series between the second output and the negative voltage supply.

* * * * *